(12) United States Patent  (10) Patent No.: US 8,259,867 B2
Huang et al.  (45) Date of Patent: Sep. 4, 2012

(54) METHODS AND SYSTEMS FOR TURBO DECODING IN A WIRELESS COMMUNICATION SYSTEM

(75) Inventors: Qiang Huang, San Jose, CA (US); Bok Tae Sim, San Ramon, CA (US); Jong Hyeon Park, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 904 days.

(21) Appl. No.: 12/176,289

(22) Filed: Jul. 18, 2008

(65) Prior Publication Data

US 2009/0175389 A1 Jul. 9, 2009

Related U.S. Application Data

(63) Continuation-in-part of application No. 11/969,724, filed on Jan. 4, 2008.

(51) Int. Cl.
*H03L 27/06* (2006.01)
*H03D 1/00* (2006.01)

(52) U.S. Cl. ........ 375/341; 375/262; 375/265; 375/316; 714/794; 714/796

(58) Field of Classification Search .................. 375/262, 375/265, 316, 341; 714/794, 796
See application file for complete search history.

(56) References Cited

U.S. PATENT DOCUMENTS

| | | | |
|---|---|---|---|
| 5,280,489 A | 1/1994 | Fredrickson et al. | |
| 5,910,969 A | 6/1999 | Sayiner et al. | |
| 5,974,091 A | 10/1999 | Huff | |
| 6,532,567 B2 | 3/2003 | Ino | |
| 6,765,507 B2 * | 7/2004 | Yokokawa et al. | 341/50 |
| 6,973,610 B1 | 12/2005 | Xu | |
| 2007/0030926 A1 * | 2/2007 | Brown et al. | 375/340 |
| 2008/0034274 A1 | 2/2008 | Song et al. | |
| 2008/0240303 A1 | 10/2008 | Shao et al. | |

FOREIGN PATENT DOCUMENTS

| | | |
|---|---|---|
| CN | 1323102 A | 11/2001 |
| CN | 1731686 A | 2/2006 |

(Continued)

OTHER PUBLICATIONS

Akay, E. et al: "High Performance Viterbi Decoder for OFDM Systems," Vehicular Technology Conference, 2004. VTC 2004-Spring. 2004 IEEE 59TH Milan, Italy, May 17-19, 2004, vol. 1, pp. 323-327, XP010765736, ISBN: 978-0-7803-8255-8.

(Continued)

*Primary Examiner* — Ted Wang
(74) *Attorney, Agent, or Firm* — Charles Chesney

(57) ABSTRACT

Certain embodiments provide methods and apparatus for decoding a string of data bits, encoded with a turbo encoding scheme, in a wireless communication system. One or more a-priori bit values corresponding to expected bit values at one or more identified bit locations in the string of data bits may be identified. One or more branch metrics used in a turbo decoding scheme may be manipulated to effectively remove decoding paths, from a collection of possible decoding paths, based at least on the identified one or more a-priori bit values, resulting in one or more remaining decoding paths. The string of data bits may be decoded by selecting a decoding path from the one or more remaining decoding paths.

28 Claims, 10 Drawing Sheets

FOREIGN PATENT DOCUMENTS

| | | | |
|---|---|---|---|
| CN | 101059544 A | | 10/2007 |
| EP | 1047063 | | 10/2000 |
| EP | 1463207 A1 | | 9/2004 |
| EP | 2066055 | | 6/2009 |
| JP | 2003505975 A | | 2/2003 |
| KR | 20050058030 A | | 6/2005 |
| TW | 554617 B | | 9/2003 |
| WO | WO0143309 A2 | | 6/2001 |
| WO | WO2007021224 | | 2/2007 |
| WO | WO2007065115 A2 | | 6/2007 |
| WO | WO2008041309 | | 4/2008 |

OTHER PUBLICATIONS

He, J.; Costello, D.J., Jr.; Huang, Y.-F.; Stevenson, R.L.: "On the application of turbo codes to the robust transmission of compressed images," Proceedings of the International Conference on Image Processing 1997, vol. 3, pp. 559-562, (Oct. 26-29, 1997) doi: 10.1109/ICIP.1997.632182; XP010253749; ISBN: 978-0-8186-8183-7.

IEEE 802.16 Working Group on Broadband Wireless Access: "IEEE 802.16 Air Interface for Fixed Broadband Wireless Access Systems," (Oct. 1, 2004), IEEE Standards, New York, XP002493540.

International Search Report—PCT/US2008/070362, International Search Authority—European Patent Office (Sep. 4, 2008).

International Search Report and Written Opinion—PCT/US2009/050695, International Search Authority—European Patent Office—Jun. 1, 2010.

Written Opinion—PCT/US08/070362, International Search Authority—European Patent Office, Sep. 4, 2008.

* cited by examiner

FIG. 10

| FIELD | SIZE (BITS) | FCH/DLFP MESSAGE FORMAT NOTES | COMMENTS |
|---|---|---|---|
| Bitmap | 6 | Bit(m) corresponding to Major Group m. Value 1 means used by this segment and Value 0 means not used Example Bit(0)='1' then MG0 is used in this seq. Bit(0..5)='111111' then MG0~MG5 are used | Variable info Predictable info |
| Reserved | 1 | Reserved field. Shall be set to '0' | Fixed info |
| Repetition type | 2 | Indicate repetiton on type used on DL MAP 0b00: No repetition factor 1 0b01: Repetition factor 2 0b10: Repetition factor 4 0b11: Repetition factor 6 | Variable info |
| Coding type | 3 | Indicate coding type used on DL MAP 0b000: TB CC 0b001: B TC 0b010: CTC 0b100: ZTCC 0b100: LDPC 0b101~0b111: Reserved | Variable info Predictable info |
| Length | 8 | Define the length in slots of the DL MAP | Variable info. Predictable |
| Reserved | 4 | Reserved field. Shall be set to '0000' | Fixed info |

METHODS AND SYSTEMS FOR TURBO DECODING IN A WIRELESS COMMUNICATION SYSTEM

CLAIM OF PRIORITY

This application is a continuation in part of, and claims the benefit of priority from, U.S. patent application Ser. No. 11/969,724, filed Jan. 4, 2008 and entitled "Decoding Scheme using A-Priori Information about Transmitted Messages," which is assigned to the assignee hereof and is fully incorporated herein by references for all purposes.

FIELD

Certain embodiments of the present disclosure generally relate to wireless communications and, more particularly, to decoding wireless transmissions.

BACKGROUND

The rapid growth in wireless communications services, such as broadband Internet access and streaming media applications, leads to an increasing demand for higher data rates. Advancements in multiplexing schemes, such as Orthogonal Frequency Division Multiplexing (OFDM) and Orthogonal Frequency Division Multiple Access (OFDMA), are important for next generation wireless communications systems. This is due to the fact that such schemes can provide many advantages including modulation efficiency, spectrum efficiency, flexibility (e.g., allowing differentiated quality of service), and strong multi-path immunity over conventional single carrier modulation schemes.

OFDM and OFDMA systems often utilize convolutional encoders at the transmitter to provide for error correction. Some systems utilize a parallel concatenated convolutional encoder (often referred to as a Turbo encoder) for encoding a code segment (e.g., a data packet) prior to transmission. Turbo encoders typically employ separate constituent encoders that operate in parallel and in combination with a code interleaver. The code interleaver mixes (interleaves) information bits in the code segment in accordance with a defined interleaving scheme. One constituent encoder encodes the information bits in the code segment to generate a first sequence of parity bits, and the other constituent encoder encodes the shuffled information bits to generate a second sequence of parity bits. The information bits and some or all of the parity bits in the first and second sequences are transmitted.

A complementary Turbo decoding is performed at a receiver unit. For each Turbo encoded segment, the received (soft value) bits are typically scaled, quantized and stored to a buffer. The information and parity bits for the first constituent encoder are then retrieved from the buffer and decoded by a first constituent decoder based on the first constituent code to provide "extrinsic" information indicative of adjustments in the confidence in the detected values for the information bits. Intermediate results that include the extrinsic information from the first constituent decoder are then stored to a storage unit in an interleaved order matching the code interleaving used at the transmitter unit.

Intermediate results and the parity bits from the second constituent encoder are then retrieved from their respective sources and decoded by a second constituent decoder based on the second constituent code to provide extrinsic information indicative of further adjustments in the confidence in the detected values for the information bits. Intermediate results that comprise the extrinsic information from the second constituent decoder are then stored to the storage unit in a de-interleaved order complementary to the code interleaving used at the transmitter unit. The intermediate results are used by the next iteration of the first constituent decoder. The decoding by the first and second constituent decoders is iterated a number of times to yield a final decoded result.

While such encoding and decoding schemes may help reduce bit error rates, with the ever increasing reliability and performance demands of wireless services, there is an ongoing need to continuously reduce bit error rates even further.

SUMMARY

Certain embodiments provide a method for decoding a string of data bits, encoded with a turbo encoding scheme, in a wireless communication system. The method generally includes identifying one or more a-priori bit values corresponding to expected bit values at one or more identified bit locations in the string of data bits, manipulating one or more branch metrics used in a turbo decoding scheme to effectively remove decoding paths, from a collection of possible decoding paths, based at least on the identified one or more a-priori bit values, resulting in one or more remaining decoding paths, and decoding the string of data bits by selecting a decoding path from the one or more remaining decoding paths.

Certain embodiments provide a receiver for decoding a string of data bits, encoded with a turbo encoding scheme, in a wireless communication system. The receiver generally includes logic for identifying one or more a-priori bit values corresponding to expected bit values at one or more identified bit locations in the string of data bits, logic for manipulating one or more branch metrics used in a turbo decoding scheme to effectively remove decoding paths, from a collection of possible decoding paths, based at least on the identified one or more a-priori bit values, resulting in one or more remaining decoding paths, and logic for decoding the string of data bits by selecting a decoding path from the one or more remaining decoding paths.

Certain embodiments provide an apparatus for decoding a string of data bits, encoded with a turbo encoding scheme, in a wireless communication system. The apparatus generally includes means for identifying one or more a-priori bit values corresponding to expected bit values at one or more identified bit locations in the string of data bits, means for manipulating one or more branch metrics used in a turbo decoding scheme to effectively remove decoding paths, from a collection of possible decoding paths, based at least on the identified one or more a-priori bit values, resulting in one or more remaining decoding paths, and means for decoding the string of data bits by selecting a decoding path from the one or more remaining decoding paths.

Certain embodiments provide a computer-program apparatus for decoding a string of data bits, encoded with a turbo encoding scheme, in a wireless communication system, which includes a computer readable medium having instructions stored thereon, wherein the instructions are executable by one or more processors. The instructions can include instructions for identifying one or more a-priori bit values corresponding to expected bit values at one or more identified bit locations in the string of data bits. The instructions can instructions for manipulating one or more branch metrics used in a turbo decoding scheme to effectively remove decoding paths, from a collection of possible decoding paths, based at least on the identified one or more a-priori bit values, resulting in one or more remaining decoding paths. The instructions can instructions for decoding the string of data bits by selecting a decoding path from the one or more remaining decoding paths.

BRIEF DESCRIPTION OF THE DRAWINGS

So that the manner in which the above recited features of the present disclosure can be understood in detail, a more particular description of the disclosure, briefly summarized above, may be had by reference to certain embodiments, some of which are illustrated in the appended drawings. It is to be noted, however, that the appended drawings illustrate only certain embodiments of this disclosure and are therefore not to be considered limiting of its scope, for the disclosure may admit to other equally effective embodiments.

FIG. 10 illustrates an example message format that may be used to generate decoding hypotheses based on a-priori information bits.

DETAILED DESCRIPTION

Figure 1:
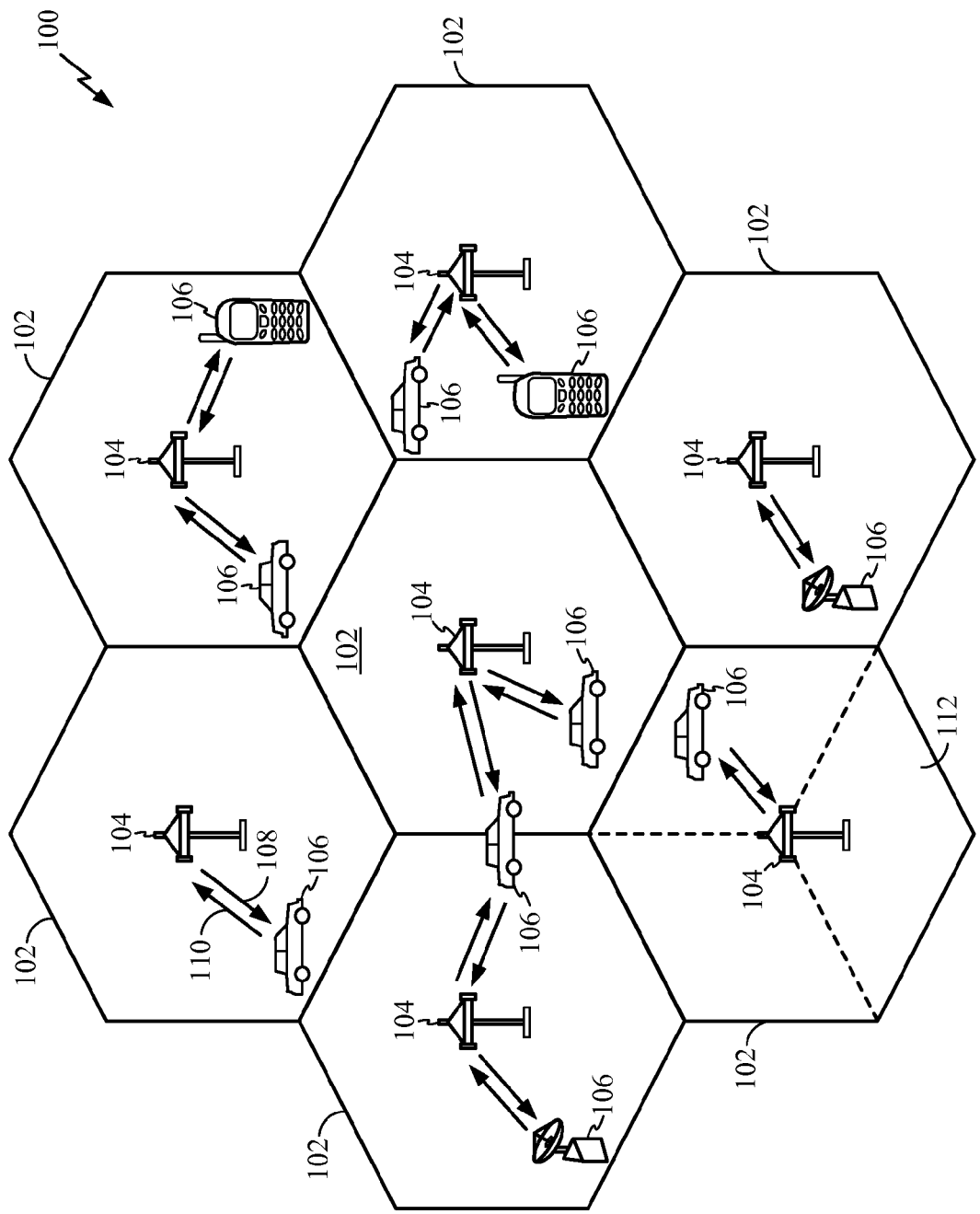
FIG. 1 illustrates an example wireless system in accordance with certain embodiments of the present disclosure.

The present disclosure generally provides techniques and apparatus for decoding convolutionally encoded wireless transmissions using a-priori information regarding a transmission. The a-priori information may be used to effectively reduce the population of possible decoded bit streams by eliminating those that include bits that are not consistent with the a-priori information. By removing these "known wrong" paths that lead to erroneous data, decoded bit error rates may be improved in some situations.

As used herein, the term a-priori information generally refers to information that is known beforehand or is predictable, such as, information proceeding from a known or assumed cause to a necessarily related effect. As will be described in greater detail below, examples of a-priori information related to a wireless transmissions may lead to expected bit values in identified bit locations in certain messages.

Examples of expected bit values may include known information bits, such as reserved bits with values specified by a standard. Expected bit values may also include bit values that are predictable, for example, based on bit values in a same field in previous transmissions or based on bit values in an expected message. These expected bit positions and bit values, whether known or predictable, are herein referred to as "API bit values" and may be used in decoding process to improve decoding performance by excluding paths that correspond to values that are in contrast to the API values.

Exemplary Wireless Communication System

The methods and apparatus of the present disclosure may be utilized in a broadband wireless communication system. The term "broadband wireless" refers to technology that provides wireless, voice, Internet and/or data network access over a given area.

WiMAX, which stands for the Worldwide Interoperability for Microwave Access, is a standards-based broadband wireless technology that provides high-throughput broadband connections over long distances. There are two main applications of WiMAX today: fixed WiMAX and mobile WiMAX. Fixed WiMAX applications are point-to-multipoint, enabling broadband access to homes and businesses, for example. Mobile WiMAX offers the full mobility of cellular networks at broadband speeds.

Mobile WiMAX is based on OFDM (orthogonal frequency-division multiplexing) and OFDMA (orthogonal frequency division multiple access) technology. OFDM is a digital multi-carrier modulation technique that has recently found wide adoption in a variety of high-data-rate communication systems. With OFDM, a transmit bit stream is divided into multiple lower-rate sub-streams. Each sub-stream is modulated with one of multiple orthogonal sub-carriers and sent over one of a plurality of parallel sub-channels. OFDMA is a multiple access technique in which users are assigned subcarriers in different time slots. OFDMA is a flexible multiple-access technique that can accommodate many users with widely varying applications, data rates, and quality of service requirements.

The rapid growth in wireless internets and communications has led to an increasing demand for high data rate in the field of wireless communications services. OFDM/OFDMA systems are today regarded as one of the most promising research areas and as a key technology for the next generation of wireless communications. This is due to the fact that OFDM/OFDMA modulation schemes can provide many advantages such as modulation efficiency, spectrum efficiency, flexibility and strong multipath immunity over conventional single carrier modulation schemes.

IEEE 802.16x is an emerging standard organization to define an air interface for fixed and mobile broadband wireless access (BWA) systems. IEEE 802.16x approved "IEEE P802.16-REVd/D5-2004" in May 2004 for fixed BWA systems and published "IEEE P802.16e/D12 October 2005" in October 2005 for mobile BWA systems. Those two standards defined four different physical layers (PHYs) and one media access control (MAC) layer. The OFDM and OFDMA physical layer of the four physical layers are the most popular in the fixed and mobile BWA areas respectively.

FIG. 1 illustrates an example of a wireless communication system 100. The wireless communication system 100 may be a broadband wireless communication system. The wireless communication system 100 may provide communication for a number of cells 102, each of which is serviced by a base station 104. A base station 104 may be a fixed station that communicates with user terminals 106. The base station 104 may alternatively be referred to as an access point, a Node B, or some other terminology.

FIG. 1 depicts various user terminals 106 dispersed throughout the system 100. The user terminals 106 may be fixed (i.e., stationary) or mobile. The user terminals 106 may alternatively be referred to as remote stations, access terminals, terminals, subscriber units, mobile stations, stations, user equipment, etc. The user terminals 106 may be wireless devices, such as cellular phones, personal digital assistants (PDAs), handheld devices, wireless modems, laptop computers, personal computers, etc.

A variety of algorithms and methods may be used for transmissions in the wireless communication system 100 between the base stations 104 and the user terminals 106. For example, signals may be sent and received between the base stations 104 and the user terminals 106 in accordance with OFDM/OFDMA techniques. If this is the case, the wireless communication system 100 may be referred to as an OFDM/OFDMA system.

A communication link that facilitates transmission from a base station 104 to a user terminal 106 may be referred to as a downlink 108, and a communication link that facilitates transmission from a user terminal 106 to a base station 104 may be referred to as an uplink 110. Alternatively, a downlink 108 may be referred to as a forward link or a forward channel, and an uplink 110 may be referred to as a reverse link or a reverse channel.

A cell 102 may be divided into multiple sectors 112. A sector 112 is a physical coverage area within a cell 102. Base stations 104 within a wireless communication system 100 may utilize antennas that concentrate the flow of power within a particular sector 112 of the cell 102. Such antennas may be referred to as directional antennas.

Figure 2:
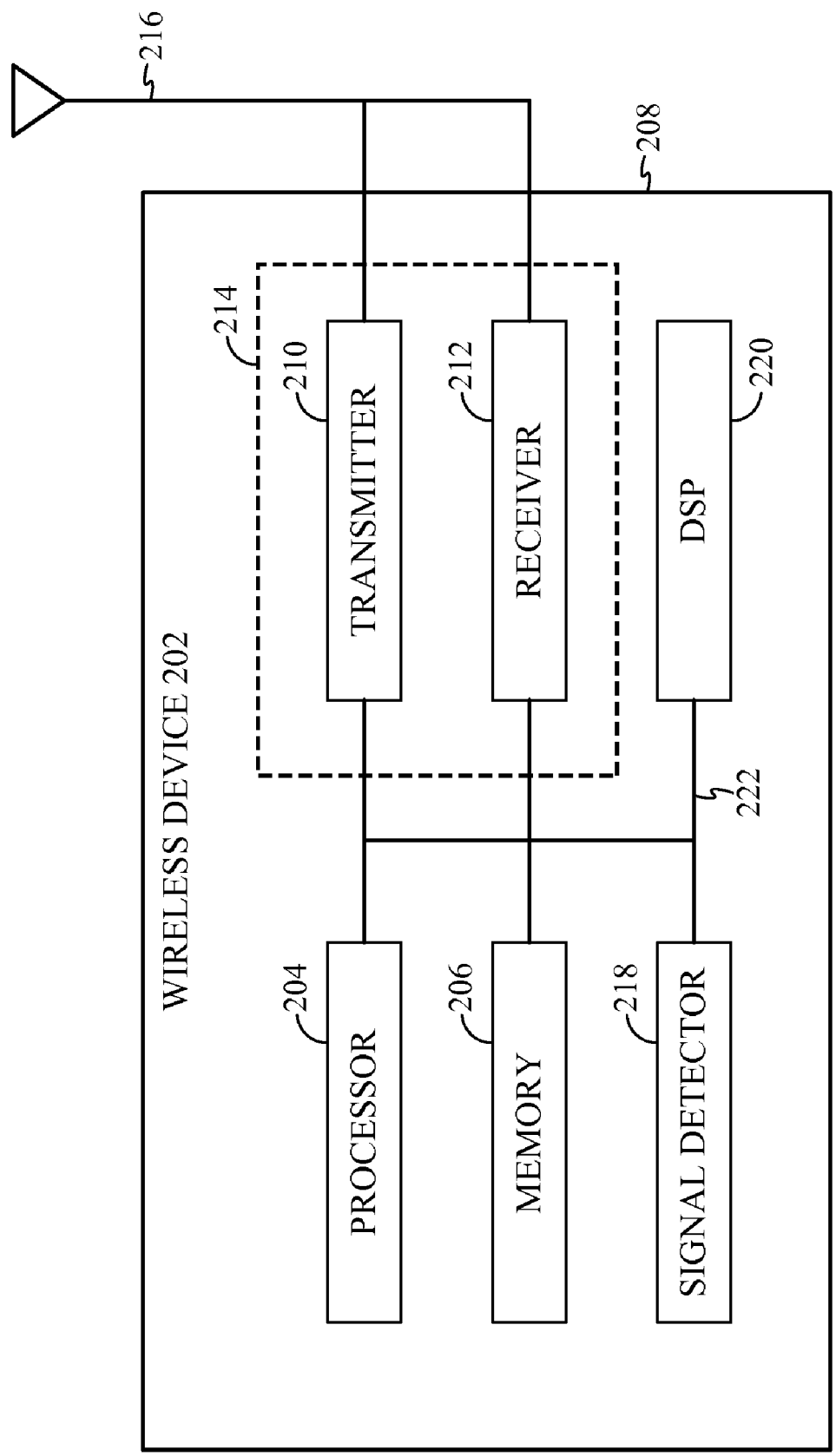
FIG. 2 is a block diagram of a wireless device in accordance with certain embodiments of the present disclosure.

FIG. 2 illustrates various components that may be utilized in a wireless device 202. The wireless device 202 is an example of a device that may be configured to implement the various methods described herein. The wireless device 202 may be a base station 104 or a user terminal 106.

The wireless device 202 may include a processor 204 which controls operation of the wireless device 202. The processor 204 may also be referred to as a central processing unit (CPU). Memory 206, which may include both read-only memory (ROM) and random access memory (RAM), provides instructions and data to the processor 204. A portion of the memory 206 may also include non-volatile random access memory (NVRAM). The processor 204 typically performs logical and arithmetic operations based on program instructions stored within the memory 206. The instructions in the memory 206 may be executable to implement the methods described herein.

The wireless device 202 may also include a housing 208 that may include a transmitter 210 and a receiver 212 to allow transmission and reception of data between the wireless device 202 and a remote location. The transmitter 210 and receiver 212 may be combined into a transceiver 214. An antenna 216 may be attached to the housing 208 and electrically coupled to the transceiver 214. The wireless device 202 may also include (not shown) multiple transmitters, multiple receivers, multiple transceivers, and/or multiple antennas.

The wireless device 202 may also include a signal detector 218 that may be used in an effort to detect and quantify the level of signals received by the transceiver 214. The signal detector 218 may detect such signals as total energy, pilot energy per pseudonoise (PN) chips, power spectral density and other signals. The wireless device 202 may also include a digital signal processor (DSP) 220 for use in processing signals.

The various components of the wireless device 202 may be coupled together by a bus system 222, which may include a power bus, a control signal bus, and a status signal bus in addition to a data bus.

Figure 3:
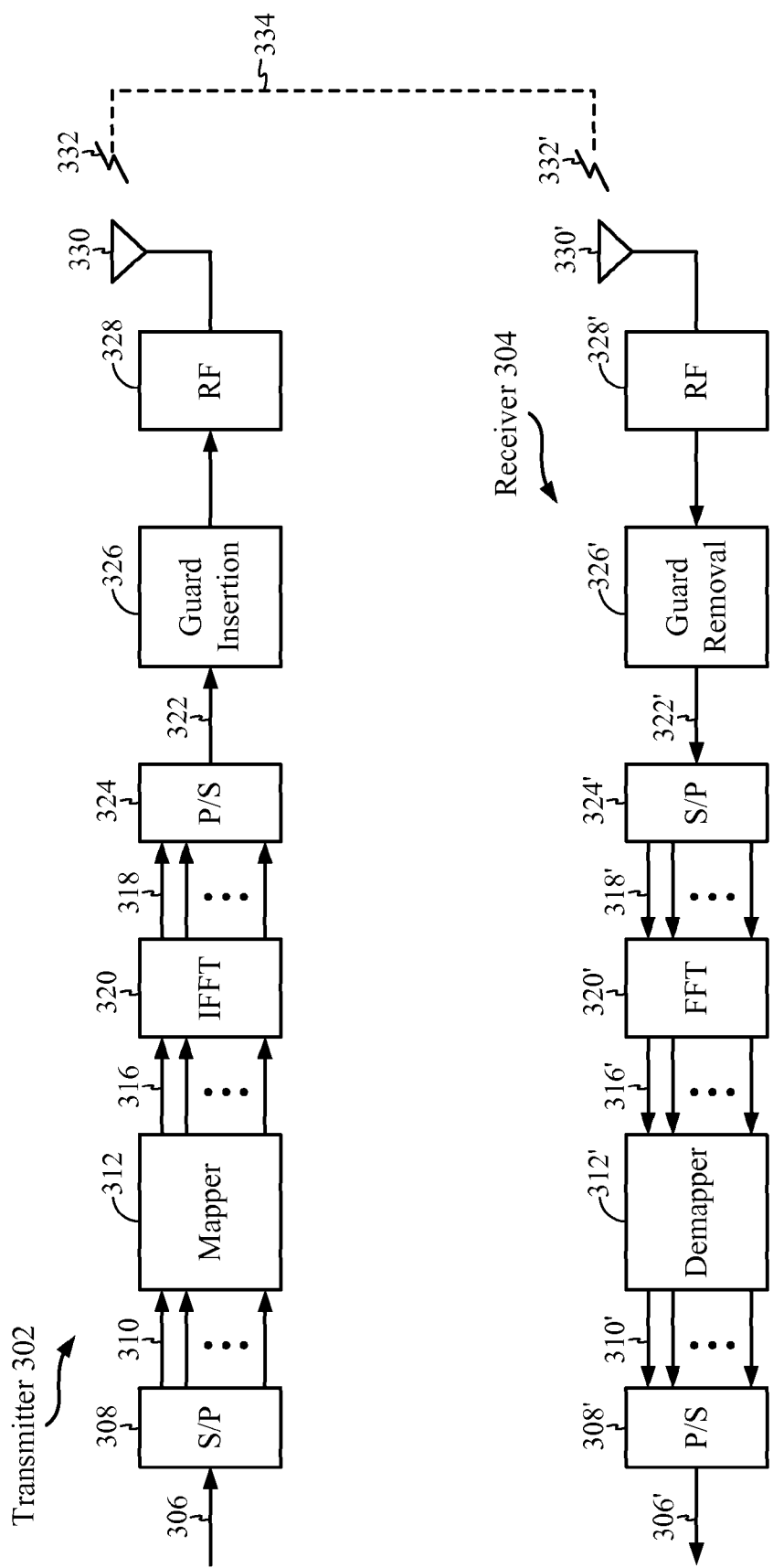
FIG. 3 illustrates a block diagram of a receiver and a block diagram of a transmitter in accordance with certain embodiments of the present disclosure.

FIG. 3 illustrates an example of a transmitter 302 that may be used within a wireless communication system 100 that utilizes OFDM/OFDMA. Portions of the transmitter 302 may be implemented in the transmitter 210 of a wireless device 202. The transmitter 302 may be implemented in a base station 104 for transmitting data 306 to a user terminal 106 on a downlink 108. The transmitter 302 may also be implemented in a user terminal 106 for transmitting data 306 to a base station 104 on an uplink 110.

Data 306 to be transmitted is shown being provided as input to a serial-to-parallel (S/P) converter 308. The S/P converter 308 may split the transmission data into N parallel data streams 310.

The N parallel data streams 310 may then be provided as input to a mapper 312. The mapper 312 may map the N parallel data streams 310 onto N constellation points. The mapping may be done using some modulation constellation, such as binary phase-shift keying (BPSK), quadrature phase-shift keying (QPSK), 8 phase-shift keying (8PSK), quadrature amplitude modulation (QAM), etc. Thus, the mapper 312 may output N parallel symbol streams 316, each symbol stream 316 corresponding to one of the N orthogonal subcarriers of the inverse fast Fourier transform (IFFT) 320. These N parallel symbol streams 316 are represented in the frequency domain and may be converted into N parallel time domain sample streams 318 by an IFFT component 320.

A brief note about terminology will now be provided. N parallel modulations in the frequency domain are equal to N modulation symbols in the frequency domain, which are equal to N mapping plus N-point IFFT in the frequency domain, which is equal to one (useful) OFDM symbol in the time domain, which is equal to N samples in the time domain. One OFDM symbol in the time domain, $N_s$, is equal to $N_{cp}$ (the number of guard samples per OFDM symbol)+N (the number of useful samples per OFDM symbol).

The N parallel time domain sample streams 318 may be converted into an OFDM/OFDMA symbol stream 322 by a parallel-to-serial (P/S) converter 324. A guard insertion component 326 may insert a guard interval between successive OFDM/OFDMA symbols in the OFDM/OFDMA symbol stream 322. The output of the guard insertion component 326 may then be upconverted to a desired transmit frequency band by a radio frequency (RF) front end 328. An antenna 330 may then transmit the resulting signal 332.

FIG. 3 also illustrates an example of a receiver 304 that may be used within a wireless communication system 100 that utilizes OFDM/OFDMA. Portions of the receiver 304 may be implemented in the receiver 212 of a wireless device 202. The receiver 304 may be implemented in a user terminal 106 for receiving data 306 from a base station 104 on a downlink 108. The receiver 304 may also be implemented in a base station 104 for receiving data 306 from a user terminal 106 on an uplink 110.

The transmitted signal 332 is shown traveling over a wireless channel 334. When a signal 332' is received by an antenna 330', the received signal 332' may be downconverted to a baseband signal by an RF front end 328'. A guard removal component 326' may then remove the guard interval that was inserted between OFDM/OFDMA symbols by the guard insertion component 326.

The output of the guard removal component 326' may be provided to an S/P converter 324'. The S/P converter 324' may divide the OFDM/OFDMA symbol stream 322' into the N parallel time-domain symbol streams 318', each of which corresponds to one of the N orthogonal sub-carriers. A fast Fourier transform (FFT) component 320' may convert the N parallel time-domain symbol streams 318' into the frequency domain and output N parallel frequency-domain symbol streams 316'.

A demapper 312' may perform the inverse of the symbol mapping operation that was performed by the mapper 312, thereby outputting N parallel data streams 310'. A P/S converter 308' may combine the N parallel data streams 310' into a single data stream 306'. Ideally, this data stream 306' corresponds to the data 306 that was provided as input to the transmitter 302.

Exemplary A-Priori Decoding

Figure 4A:
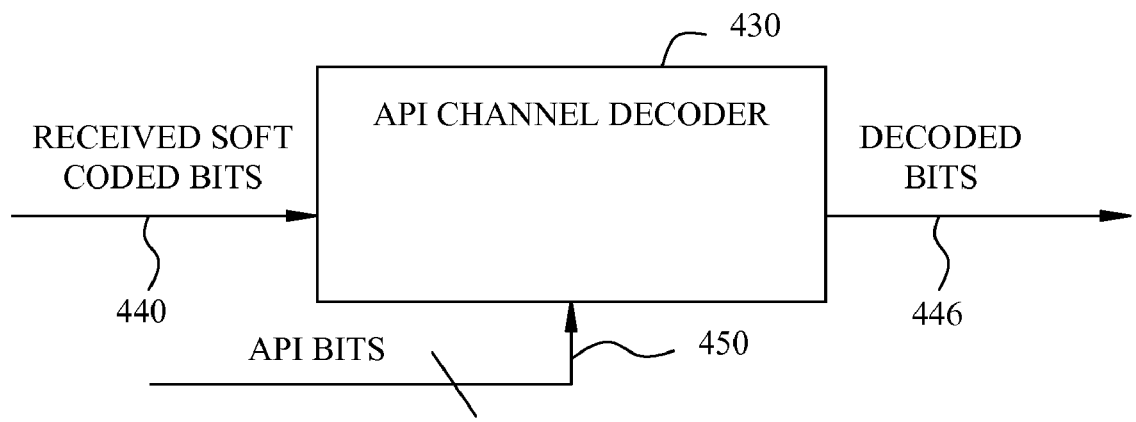
FIGS. 4A and 4B illustrate block diagrams of a-priori information (API) decoders in accordance with certain embodiments of the present disclosure.
Figure 4B:
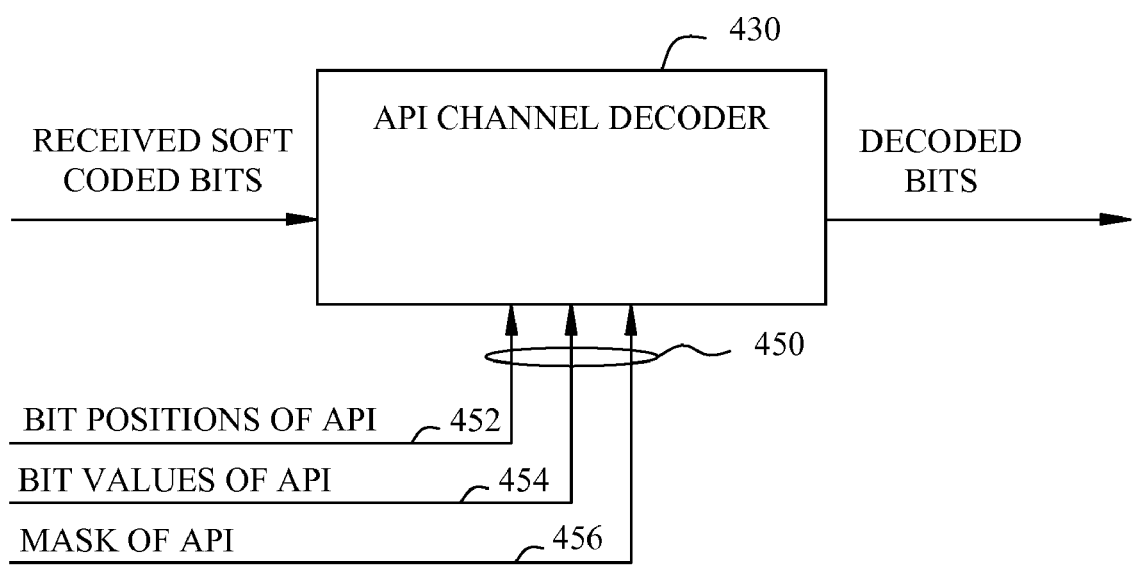

FIG. 4A is a block diagram of a decoder 430 capable of performing decoder operations based on a-priori information in accordance with certain embodiments of the present disclosure. API information may be used in a variety of different decoding schemes, such as Viterbi decoding schemes, Turbo coding/decoding, LDPC coding/decoding, RS coding/decoding, BCH coding/decoding and various other schemes.

API information may be provided as a set of API bits 450 that correspond to expected bit values (e.g., known or predictable) bit values of certain bit locations of a coded stream of bits. The decoder 430 is configured to generate a set of decoded bits 446 from a set of "soft (or hard)" received/encoded bits 440. As will be described in greater detail below, the decoder 430 may be configured to eliminate from consideration decoding candidate paths that would result in decoded bits 446 with values that are inconsistent with the values indicated by the API bits 450.

In the case of schemes that utilize systematic codes, coded bits may include systematic bits (information before encoding) and parity bits (redundancy bits resulting from encoding). API decoding scheme may be applied to the systematic bits. In other words, API bit values may include known values of the systematic bits based on the particular systematic codes used. To apply API for systems utilizing systematic codes, bits of received data may be replaced with (known/predicted) API bit values at the front end of the decoder. In this manner, the probability of successful decoding may be increased using API for systematic decoders.

One or more components of the decoder 430 may be controlled by the API bits 450 in order to prevent the selection of decoding paths that correspond to bit values that are inconsistent with the a-priori information. In other words, the API bits 450 may contain sufficient information to indicate particular values ("0" or "1") that are known (or predicted) for certain bit locations in a sequence of bits being decoded. Any bit string that has a value other than the value specified in the API bits 450 is not a valid decoded bit string. Thus, the decoder may remove decoding paths corresponding to these invalid bit strings from consideration during path selection.

The API bits 450 generally include sufficient information to identify one or more bits in a decoded bit string that have bit values that are known (or predictable) based on a-priori information and, additionally, what those bit values are. The actual format in which this information is conveyed may vary with certain different embodiments and according to actual implementation schemes.

For example, for certain embodiments, the API bits 450 may include three types of information: an indication of bit positions 452, bit values 454, and, optionally, API mask bits 456. The bit positions 452 may provide an indication of bit locations (within an encoded sequence) that have known values, while the bit values 454 provide the actual known values ("0" or "1") of an encoded bit. FIG. 10, described in detail below, provides an example of known values for certain bit positions based on a-priori knowledge of a message format.

The API bit positions 452 may identify bit positions correspond to the position of a known/predicted encoded bit in trellis structure. According to certain embodiments, the API bit positions 452 may explicitly identify bit positions that have known values, while all other bit positions are considered "unknown." The corresponding bit value of "0" or "1" in the bit values 454 may thus be used to identify valid transitions in the trellis structure and effectively remove decoding paths involving invalid transitions. An example of removing decoding paths is described in detail below with reference to FIG. 9.

For certain embodiments, a mask function may be realized by utilizing the API mask bits 456 to identify bit positions whose API bit value should be ignored. Such a mask function may be useful and add flexibility, for example, when a standard changes causing a previously known bit value to become unknown. Setting the mask bit may provide a simple mechanism to efficiently accommodate such changes. A mask function may also be realized by manipulating the API bit positions 452 to remove the identification of a bit position that no longer has a known value, thus providing an alternative to changing a value in the bit mask value and/or eliminating the need for the bit mask value at all.

Exemplary Hypothesis Engine

For certain embodiments, a Hypothesis Engine may be provided to generate "hypotheses" that each includes a set of API bit values to use in performing API decoding. Depending on a particular implementation, a Hypothesis Engine may generate a single hypothesis or multiple hypotheses that may differ in which bits have known values and what those bit known values are. Evaluating multiple hypotheses may be useful, for example, when there are only a limited number of valid bit combinations, for a given sequence.

Figure 5:
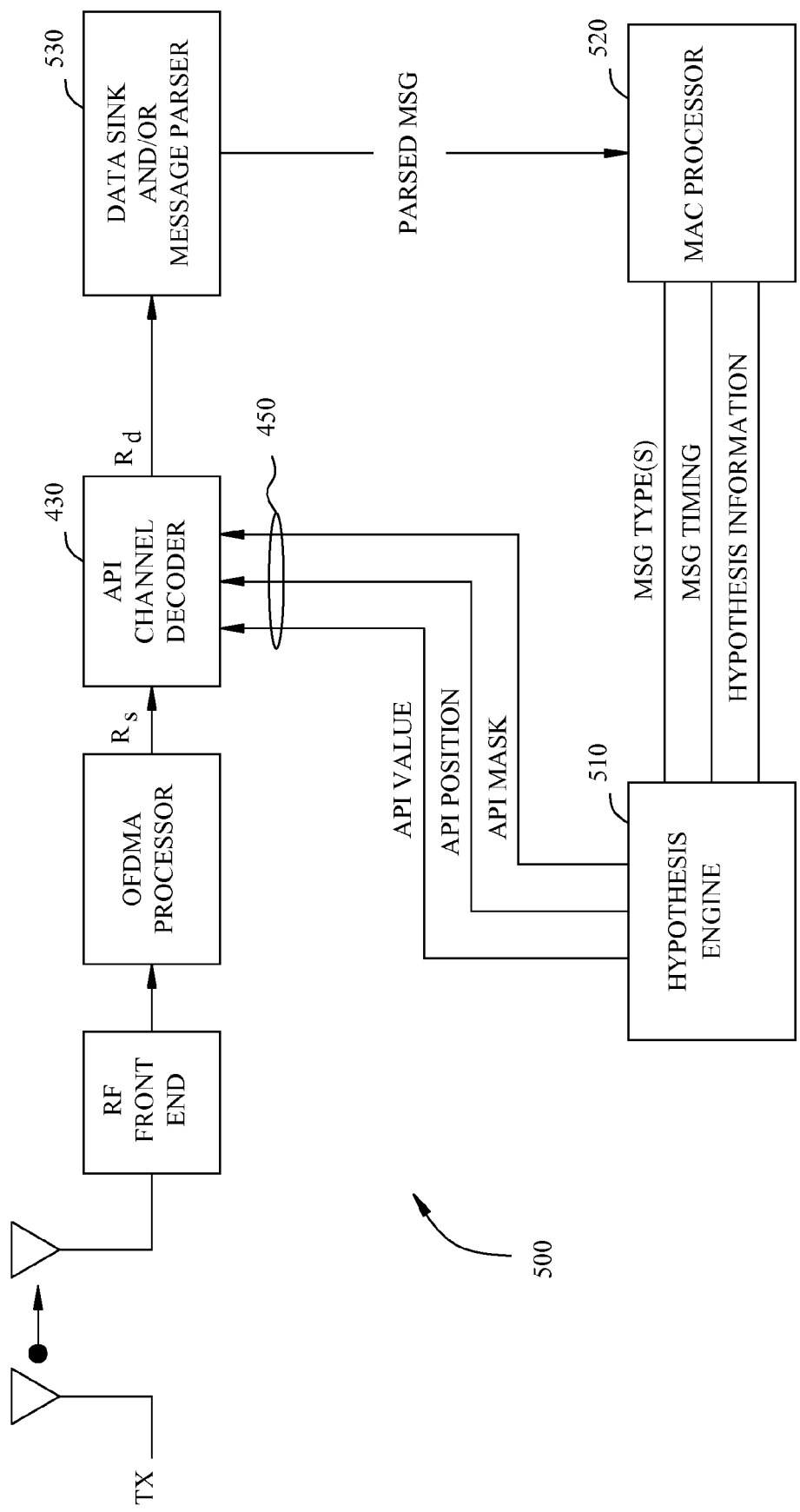
FIG. 5 illustrates an example receiver architecture in accordance with certain embodiments of the present disclosure.

FIG. 5 illustrates a receiver circuit 500 that includes an API decoder 430 and a Hypothesis Engine 510. As illustrated, the Hypothesis Engine 510 may receive information regarding a message from a medium access control (MAC) processor 520 and generates API bit values (a hypothesis) for use by the API decoder 430. The API decoder 430 starts to decode received soft (or hard) bits Rs using the API bit values provided by the Hypothesis Engine 510. The API decoder 430 outputs decoded data bits Rd, which are delivered to a message parser 530.

If the message parser 530 detects that the decoded bits are for a kind of message, the message is parsed and delivered to a MAC (medium access control) processor 520. The MAC Processor 520 may function as a type of protocol analyzer, analyzing the received data, for example, in an effort to determine what the next possible message type(s) are and what the timing will be.

As an example, the MAC Processor 520 may recognize the first incoming message (or data) will be FCH/DLFP message, which is followed by a downlink preamble. In some cases, the MAC Processor 520 may use some information from a previous frame, for example, to determine a coding rate, message length, or some other parameter. The MAC Processor 520 may provide this information to the Hypothesis Engine 510 that will use it to extract known bit values (or predict bit values) for particular bit locations and generate API information to forward to the API decoder.

Figure 6:
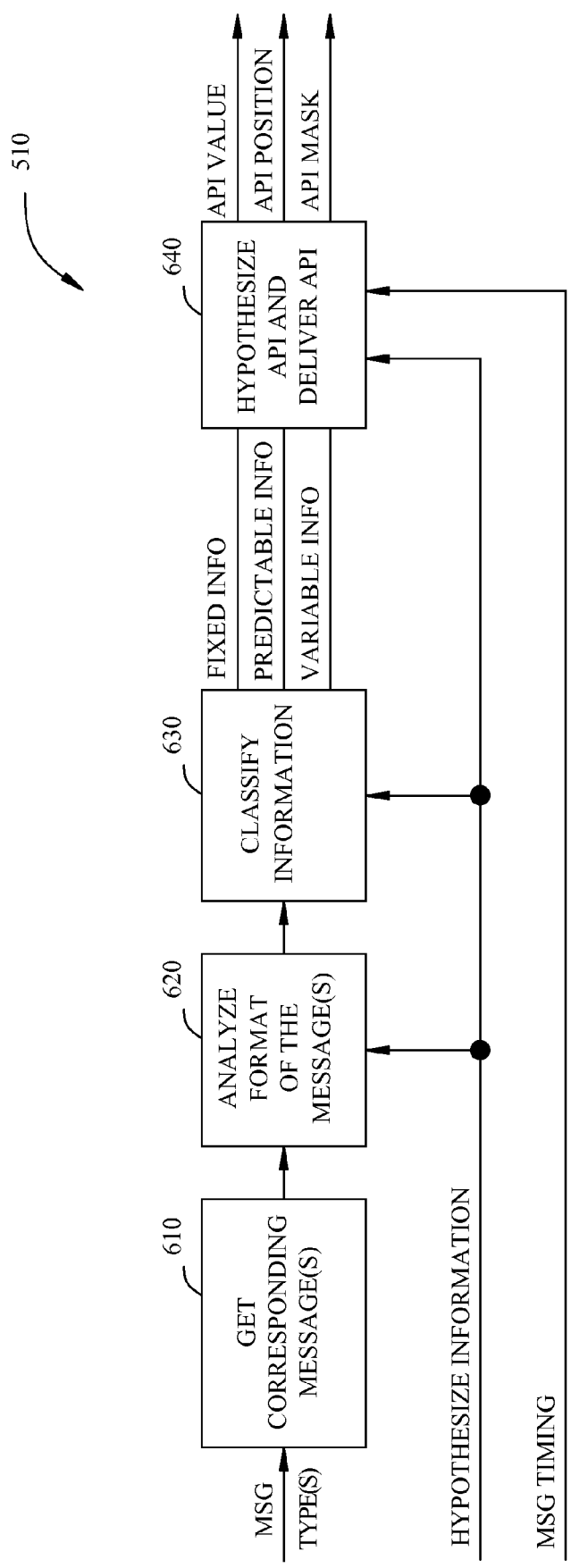
FIG. 6 illustrates an example hypothesizer capable of generating hypotheses indicating one or more expected bit values in accordance with certain embodiments of the present disclosure.

FIG. 6 illustrates example components of a Hypothesis Engine 1110 that may be used to generate decoding hypotheses based on a-priori information and message information provided by the MAC Processor 520. As illustrated, the Hypothesis Engine receives an indication of a message type and includes logic 610 to retrieve the corresponding message (s) designated by the message type and the format of the message(s) are analyzed by format logic 620.

For certain embodiments, in addition to bit locations with fixed/known bit values (such as reserved bits set to a known value according to a standard), hypotheses may be generated with information that is predictable. As an example, bit information may be predictable based on a value from a previously received message (e.g., a coding type may not likely change from one message to the next).

Thus, classify logic 630 may classify bit information in a given message into at least three categories: fixed information, predictable information, and variable information. The fixed (known) information generally refers to information that is fixed so that it is known 100% from initial stage or some bit values that are known under some conditions (e.g., after checking the decoding results of related messages). For example, the decoded results of messages relating to data to be decoded, such as messages or data that are known to be positioned before the data to be decoded, may be analyzed and API information may be extracted from the analyzed data.

The predictable information may include information that can be predictable under certain conditions or assumptions so it could provide different candidate values or bit combinations for a set of one or more bits. Different candidate values may be included in different hypotheses. For example, the predictable information may include some information predictable under certain conditions or assumptions or information that is predictable after checking decoding results of related messages.

Variable information generally includes information that is unknown or too difficult to predict so it is generally not used as API bit values (e.g., the API bit position values for these bit locations may be set to "0"). After classifying the information bits, Hypothesis API and Delivery logic 640 of the hypotheses engine may generate a set or sets of API bit values (each set corresponding to a hypothesis) using the classified information. For example, the logic 640 may construct the API bit location, bit value, and mask strings, to be output to the decoder 230.

The API decoding scheme presented herein may be applied to a variety of different types of messages. For example, API decoding may be applied to (FCH) Downlink Frame Prefix (DLFP) messages, as described below, Normal Downlink MAP (DL-MAP) messages, Compressed DL-MAP messages, Uplink MAP (UL-MAP) messages, Bandwidth Request (BW-REQ) messages, Initial Ranging Request (IRNG-REQ) messages, and so on. As will be described in greater detail below, a frame control header (FCH) Downlink Frame Prefix (DLFP) message 1000, as depicted in FIG. 10, provides a good example of various bits of information that may be classified as fixed, predictable and variable.

Exemplary API-Based Turbo Decoding

As described above, API bits may be utilized to improve decoding performance in a variety of different decoding schemes, including convolutional turbo coding (CTC) decoding schemes. For example, in a CTC decoding scheme, after identifying one or more a-priori bit values corresponding to expected (e.g., known or predictable) bit values at one or more identified bit locations in the string of data bits, one or more branch metrics may be manipulated to effectively remove decoding paths, from a collection of possible decoding paths, based at least on the identified one or more a-priori bit values, resulting in one or more remaining decoding paths.

The string of data bits may then be decoded by selecting a decoding path from the one or more remaining decoding paths.

Figure 7:
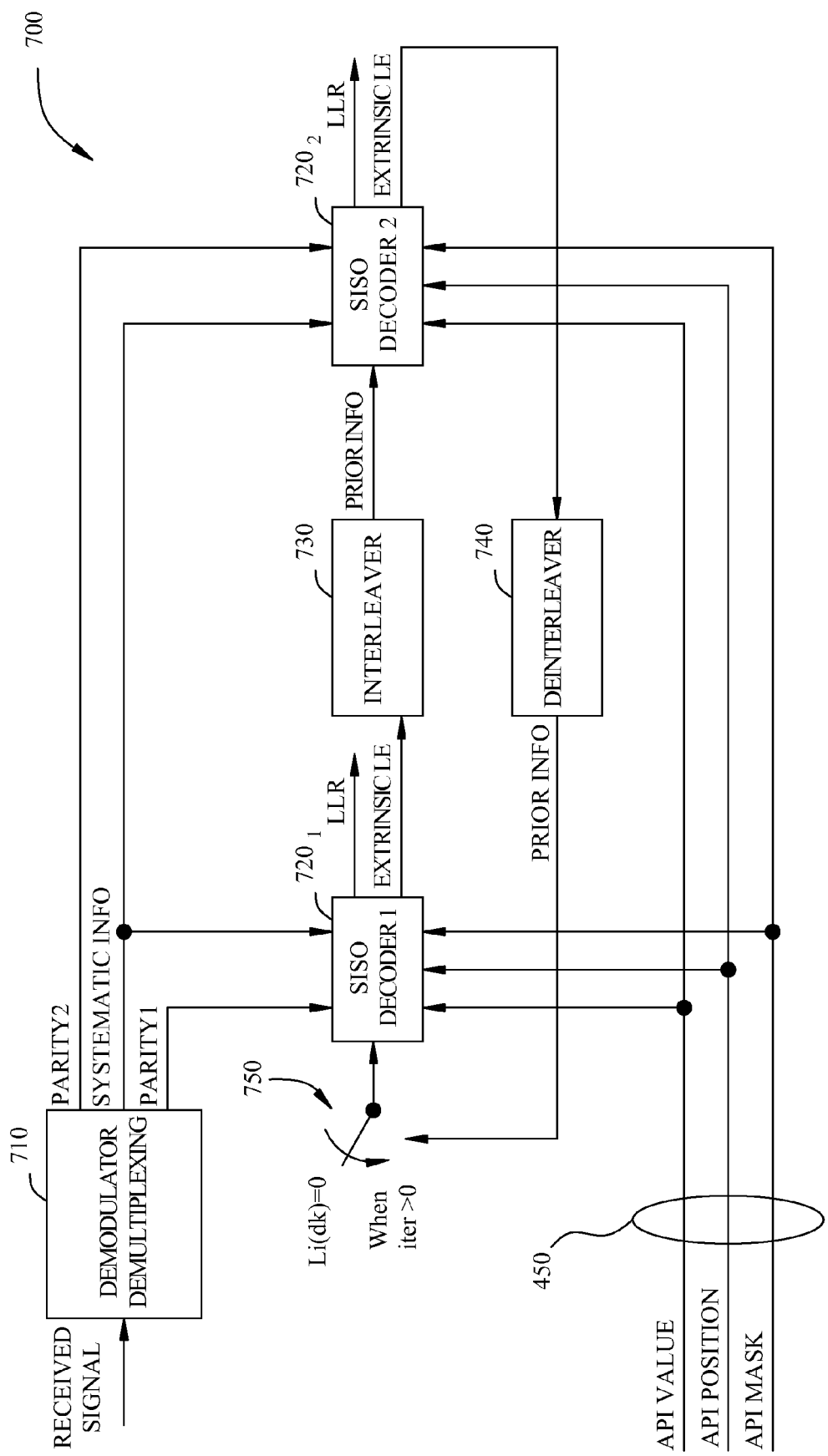
FIG. 7 illustrates an example API turbo decoder in accordance with certain embodiments of the present disclosure.

FIG. 7 illustrates an example CTC decoder 700 which includes two constituent decoders $720_1$ and $720_2$. As illustrated, each decoder may receive system and parity bits, as well as prior information, and generate extrinsic information (Le) and log likelihood ratio (LLR) information.

The extrinsic information generated by the first decoder $720_1$ may be fed into the second decoder $720_2$ as the prior information, after an interleaving process 730. Similarly, the extrinsic information generated by the second decoder $720_2$ may be fed into the first decoder $720_1$ as the prior information, after a de-interleaving process 740. The prior information may be initialized to zero values, generally corresponding to an initial state where all system bits have equal probabilities of being transmitted. The prior information will get updated during the decoding process, to indicate changing probabilities of system bits based on the received values.

For certain embodiments, the CTC decoder may utilize API bits in an effort to improve decoding performance. For example, as illustrated, the decoders $720_1$ and $720_2$ may receive, as input, API information 450 including a set of API values, API positions and API mask bits as input.

As previously described, the API value may indicate a '1' or '0' corresponding to the known or predicted value of an original system bit being transmitted. Decoding performance of the CTC decoder 700 may be improved as the decoders $720_1$ and $720_2$ may be configured to eliminate "known wrong" decoding paths from consideration, based on the a-priori information captured in the API bit values 450.

Figure 8:
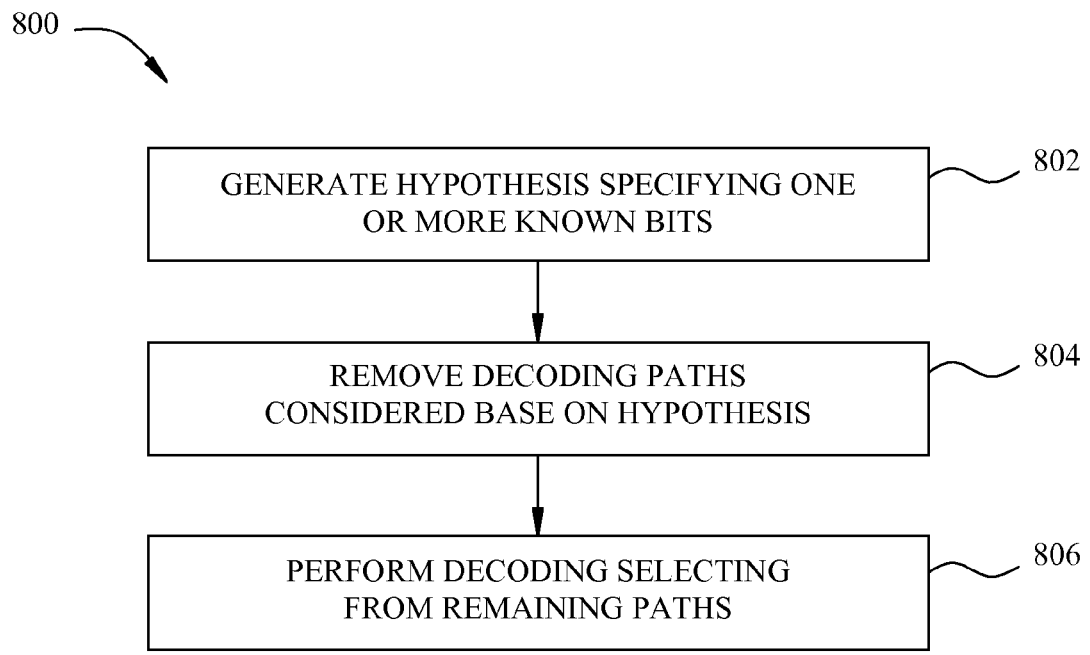
FIG. 8 is a flow diagram of example operations for a-priori decoding in accordance with certain embodiments of the present disclosure.

FIG. 8 illustrates example operations 800 for API decoding that may be utilized with the CTC decoder 700. The operations begin, at 802, by generating a hypothesis based on a-priori information (e.g., with the previously described hypothesis engine). At 804, decoding paths that result in bit values inconsistent with the API bit values of the hypothesis are removed. Finally, at 806, decoding is performed based on a selection of one of the remaining decoding paths.

Figure 9:
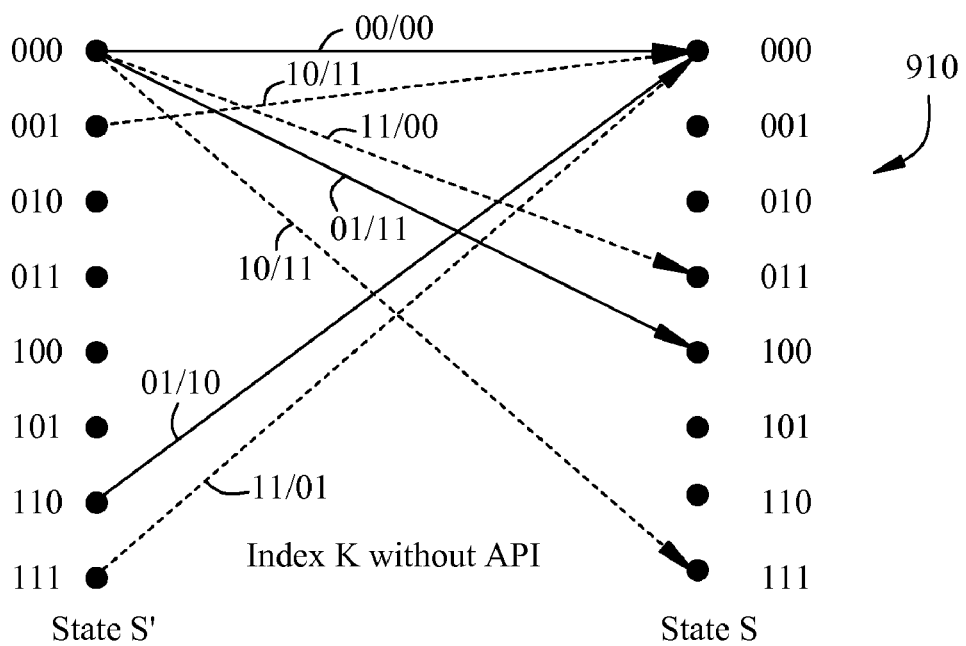
FIG. 9 illustrates an example of a Trellis diagram with a full set of decoding paths and a set of decoding paths that has been reduced based on a-priori information bits, in accordance with certain embodiments of the present disclosure.
Figure 9:
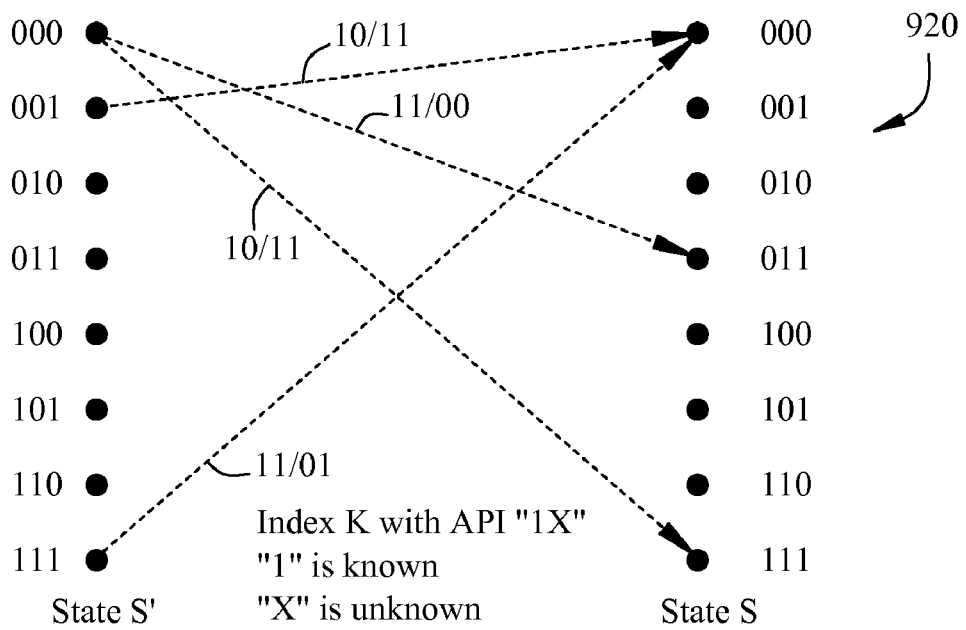

Removing "known bad" paths based on API bit values is illustrated in FIG. 9, which shows decoding paths based on allowable state transitions of a trellis structure with 3-bit states. The illustrated example assumes a coding rate of ½ and a K=4 (with a 3-bit, K-1, state register).

The top diagram 910 in FIG. 9 illustrates an example of a conventional CTC decoding scheme which calculates all possible decoding paths branch metrics. In other words, the illustrated scheme does not utilize API bits but, rather assumes all input bits are unknown. The illustrated diagram shows a state transition trellis structure with 3-bit states.

The illustrated example assumes a coding rate of ½ and a K=4 (with a 3-bit, K-1, state register). Solid arrows indicate state transitions corresponding to the transmission of (system and parity) bits with a value "0X," while dashed arrows indicate state transitions corresponding to the transmission of bits with a value "1X."

According to API decoding, state transitions that correspond to input bits that are inconsistent with known values may be eliminated from consideration, thereby effectively eliminating any paths including these transitions from the final selection. As an example, if a known API bit value corresponds to a transmission of bit values "1X" the state transitions with dashed lines will be evaluated, while the metrics for state transitions with solid lines (corresponding to bit values of "0X") do not need to be calculated because they are part of paths that correspond to invalid bit streams that should not be considered for selection.

This is illustrated in the bottom diagram 920 illustrated in FIG. 9. The state transitions corresponding to transmitted bit values of "0X" are eliminated, leaving the remaining state transitions corresponding to transmitted bit values of "1X" to be evaluated. In the illustrated example, this results in a reduction of paths to evaluate from seven total to four. While this reduction in paths may reduce computational overhead, it may also result in reduced error rates, as "known bad" paths are eliminated from consideration. Thus, the decoder will not erroneously select one of these "known bad" paths.

Several methods may be utilized to eliminate "known wrong" decoding paths that correspond to bit values that are inconsistent with API bits in an API-based CTC decoder. For certain embodiments, prior information calculations and LLR information (used by the constituent decoders) may be manipulated to effectively eliminate paths corresponding to bit strings with values that are inconsistent with API bits by reducing the probability that those paths will be selected.

For example, for certain embodiments, prior information may be set to a maximum value (e.g., large positive value) for a branch if the input bits of that branch are known and are the same as the API bits to increase the chance such a path will be considered. On the other hand, prior information may be set to a minimum value (e.g., zero or a negative value) for a branch if the input bits of the branch are known and are not the same as the API bits to effectively eliminate the chance such a path will be considered.

For example, in the following equation for the likelihood that a bit value at a time index i has a value of k:

$$L_i(d_k) = \ln \frac{P[d_i = k]}{P[d_i = 0]} \quad (1)$$

may be assigned a positive maximum value if the API value is k at time index i or a minimum value if the API value is not k at time index i. The actual (minimum and maximum) values assigned may depend on different factors, such as the bit width of the prior information.

Referring back to the example shown in FIG. 9, bit values for k may be "01," "10" or "11." This may effectively increase the difference of the branch probability values corresponding to different transmitted system information. The log likelihood ratio at index i may be expressed as:

$$L_i(\hat{d}_k) = \ln \frac{P[d_i = k \mid R_1^N]}{P[d_i = 0 \mid R_1^N]} \quad (2)$$

where $R_1^N$ are received system and parity bits from index 1 to N. A Max-Log-Map algorithm may be expressed as $$L_i(\hat{d}_k) = \max_{\forall s}(\alpha_i^s + \beta_i^{f(k,s)} + \lambda_i^{k,s}) - \max(\alpha_i^s + \beta_i^{f(0,s)} + \lambda_i^{0,s}), \quad (3)$$

where $\alpha_i^s$ is the forward state probability of state s at index i, $\beta_i^{f(k,s)}$ is the backward state probability of state transitioned from s with input k at index i, $\lambda_i^{k,s}$ is the branch probability at index i start from state s and with a system input "k".

Increasing the difference between branch probability $\lambda_i^{k,s}$ and $\lambda_i^{0,s}$ may help ensure that $L_i(\hat{d}_k)$ is a positive maximum value when system info with value "k" (corresponding to API bit values of "1X" in the example of FIG. 9) is transmitted, thus leading to the correct decoded value of "k". This result may be achieved by setting prior info at index i to positive maximum value for input "k", and a negative maximum for input other than "k". This setting should result in $\ln P(d_i=k)$, a Posteriori Probability, in the branch metric equation below to a minimum value. Referring to the CTC decoder shown in FIG. 7, the equation for branch metric may be expressed as $$\lambda_i^{k,s} = x_i[1]*k[1] + x_i[0]*k[0] + y_i[1]*p[1] + y_i[0]p[0] + \ln P (d_i = k) \quad (4)$$

where $x_i$ are the received system bits at index i, $y_i$ are the received parity bits at index i, k and p are the transmitted system and parity information bits at index i.

From Equation 1 above, it may be observed that setting prior information bits to a positive or negative maximum value may result in values for $\ln P(d_i=k)$ that range from negative infinity to zero. In addition, setting prior information bits to a known value may help with the forward/backward state probability recursive calculation. Forward and backward probabilities in CTC decoding may be expressed by the following equations:

$$\alpha_i^0 = \max(\alpha_{i-1}^0 + \lambda_i^{0,0}, \alpha_{i-1}^1 + \lambda_i^{2,1}, \alpha_{i-1}^6 + \lambda_i^{1,6}, \alpha_{i-1}^7 + \lambda_i^{3,7}) \quad (5)$$

$$\beta_{i-1}^0 = \max(\beta_i^0 + \lambda_i^{0,0}, \beta_i^3 + \lambda_i^{3,0}, \beta_i^4 + \lambda_i^{1,0}, \beta_i^7 + \lambda_i^{2,0}) \quad (6)$$

which may be used to get forward and backward probabilities for each state. The calculations for each state may require calculating 4 possible branches for both forward and backward probabilities.

By taking advantage of known information regarding particular bit values, however, an API CTC decoder may be able to simplify these calculations. For example, maintaining the example illustrated in FIG. 9, assuming a "1x" was transmitted (the first bit is a known value "1" at time index i) the two branches corresponding to branches for inputs "0x" may be ignored. Thus, the state probability calculation may be simplified by removing the corresponding terms as follows:

$$\alpha_i^0 = \max(\alpha_{i-1}^1 + \lambda_i^{2,1}, \alpha_{i-1}^7 + \lambda_i^{3,7}) \quad (7)$$

$$\beta_{i-1}^0 = \max(\beta_i^3 + \lambda_i^{3,0}, \beta_i^7 + \lambda_i^{2,0}) \quad (8)$$

The API information may also increase the probability differences between $\alpha_i^0$ to $\alpha_i^7$ and $\beta_{i-1}^0$ to $\beta_{i-1}^7$.

Exemplary API Decoding based on Frame Control Header

A frame control header (FCH) Downlink Frame Prefix (DLFP) message 1000, as depicted in FIG. 10, provides a good example of various known/predictable bits that may be considered as API bits for CTC decoding. The format and content of a FCH message is defined in IEEE 802.16e OFDMA standard. The DLFP is a data structure transmitted at the beginning of each frame and contains information regarding the current frame and is mapped to the FCH. Therefore, successful decoding of the DLFP is very important to process a whole frame. The classification of some bits may change over time (e.g., from predictable to known or vice-versa), for example, after a transition from an initial acquisition state to detecting a first message frame. In the following discussion, "0b" is used to denote (binary bit values).

As an example of potential API bits, a bitmap field 1010 includes 6 bits, with each bit indicating whether a corresponding message group is used by a segment. In an initial acquisition state, these bits are unknown. However, after initial decoding and identifying a message segment, at least one of the bits will be identified (e.g., assuming the first message group bit is used API bits="0b1XXXXX"). Further, in a normal operation state, the mobile station can predict all 6 of the bits, assuming the base station sends the same bitmap as in the previous frame.

Bits of the reserved fields 1020 and 1022 may remain fixed so long as the standard is not changed. In contrast, the 2 bits of the repetition type field 1030 may be difficult to predict and can change from frame to frame, thus these bits may not be good candidates for use as API bits.

The 3-bit coding type field may be classified in different ways and used to generate a number of different hypotheses. For example, without placing any conditions on the types of coding, the 3-bit field could be treated as variable. However, using a-priori information, some of these bits may be treated as fixed. For example, if it is known that a current version of WiMax supports only two types of coding, TBCC (0b000) and CTC (0b010), the first and third bits may be treated as known bit values of "0" (API bits="0b0X0"). If using the CTC decoder as shown in FIG. 7, it may be known that CTC coding is being used (and bit values of "0b010" may be used).

While the 8-bit length field may vary from frame to frame, some of the bits may be classified in different manners. As an example, imposing no limitation on the length field all 8 bits would be variable. However, in most cases, a length of a DL-MAP will be less than $2^7$, such that the MSB may be predicted to be a "0" (API bits="0b0XXXXXXX"). While this prediction may not be true, the improvement in bit error rate achieved may outweigh any performance penalty in having to re-decode using a different hypothesis. More aggressive hypotheses may also be generated in a similar manner, for example, assuming the length is less than $2^6$ (API bits="0b00XXXXXX") or less than $2^4$ (API bits="0b0000XXXX").

By utilizing these known or predictable values as API bits, performance of the API CTC decoder shown in FIG. 7 may be improved. In other words, by eliminating decoded strings including "known wrong" bit values, the possibility of incorrectly decoding the received bit string may be significantly reduced, thereby improving overall bit error rate.

Performance improvements of the decoding scheme proposed herein has been confirmed in simulations. For certain embodiments, a performance evaluation was performed via simulation, with the API CTC decoding scheme for decoding a FCH/DLFP message of IEEE 802.16e. The FCH/DLFP message of the simulated configuration contains 24 bits information, with the API information including 5 bits out of 24 bits that are reserved bits that shall be set zeros.

The simulation configuration assumed AWGN, no frequency and timing offset, and perfect synchronization. For the FCH/DLFP message, the modulation and coding is QPSK, CTC (r=½), with a repetition factor of 4. With this configuration setup, simulations show the proposed API decoding scheme achieves approximately 0.6 dB gain at PER $10^{-2}$ in AWGN channel, when compared to non-API decoding schemes.

Figure 8A:
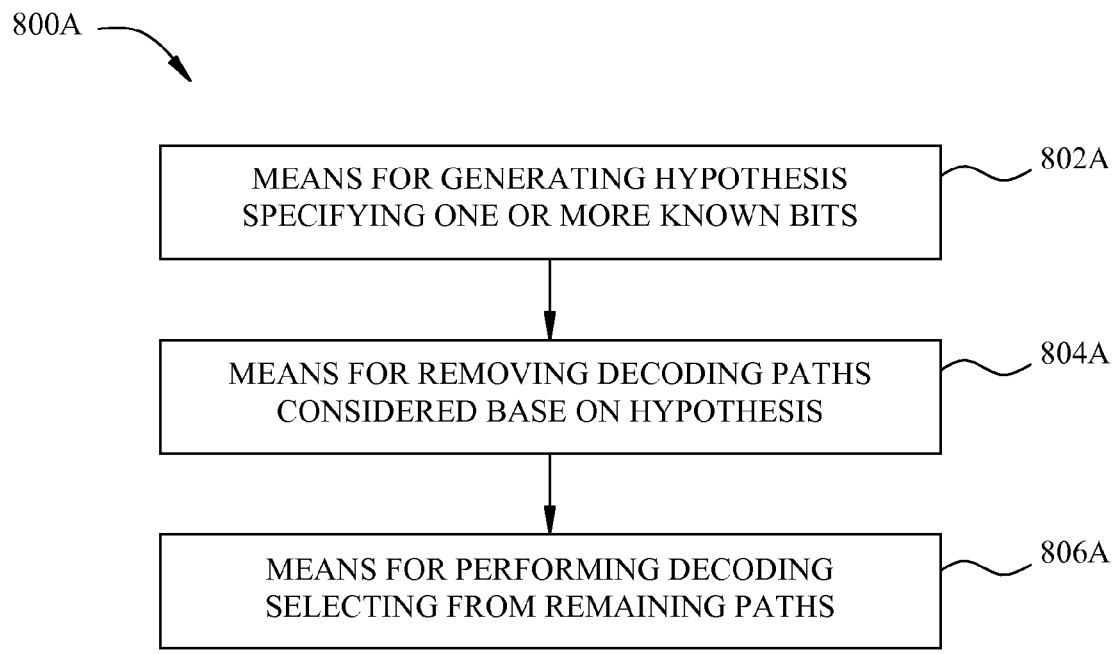
FIG. 8A illustrates example components capable of performing operations shown in FIG. 8.

The various operations of methods described above may be performed by various hardware and/or software component(s) and/or module(s) corresponding to means-plus-function blocks illustrated in the Figures. For example, blocks 802-806 illustrated in FIG. 8 correspond to means-plus-function blocks 802A-806A illustrated in FIG. 8A. More generally, where there are methods illustrated in Figures having corresponding counterpart means-plus-function Figures, the operation blocks correspond to means-plus-function blocks with similar numbering.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

Information and signals may be represented using any of a variety of different technologies and techniques. For example, data, instructions, commands, information, signals and the like that may be referenced throughout the above description may be represented by voltages, currents, electromagnetic waves, magnetic fields or particles, optical fields or particles or any combination thereof.

The various illustrative logical blocks, modules and circuits described in connection with the present disclosure may be implemented or performed with a general purpose processor, a digital signal processor (DSP), an application specific integrated circuit (ASIC), a field programmable gate array signal (FPGA) or other programmable logic device, discrete gate or transistor logic, discrete hardware components or any combination thereof designed to perform the functions described herein. A general purpose processor may be a microprocessor, but in the alternative, the processor may be any commercially available processor, controller, microcontroller or state machine. A processor may also be implemented as a combination of computing devices, e.g., a combination of a DSP and a microprocessor, a plurality of microprocessors, one or more microprocessors in conjunction with a DSP core or any other such configuration.

The steps of a method or algorithm described in connection with the present disclosure may be embodied directly in hardware, in a software module executed by a processor or in a combination of the two. A software module may reside in, or be stored or encoded onto, any form of storage medium that is known in the art. Some examples of storage media that may be used include RAM memory, flash memory, ROM memory, EPROM memory, EEPROM memory, registers, a hard disk, a removable disk, a CD-ROM and so forth. A software module may comprise a single instruction, or many instructions, and may be distributed over several different code segments, among different programs and across multiple storage media. A storage medium may be coupled to a processor such that the processor can read information from, and write information to, the storage medium. In the alternative, the storage medium may be integral to the processor.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in software, the functions may be stored as instructions or as one or more sets of instructions on a computer-readable medium or storage medium. A storage media may be any available media that can be accessed by a computer or by one or more processing devices. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

Further, it should be appreciated that modules and/or other appropriate means for performing the methods and techniques described herein, such as those illustrated in the Figures, can be downloaded and/or otherwise obtained by a mobile device and/or base station as applicable. For example, such a device can be coupled to a server to facilitate the transfer of means for performing the methods described herein. Alternatively, various methods described herein can be provided via a storage means (e.g., random access memory (RAM), read only memory (ROM), a physical storage medium such as a compact disc (CD) or floppy disk, etc.), such that a mobile device and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims While the foregoing is directed to embodiments of the present disclosure, other and further embodiments of the disclosure may be devised without departing from the basic scope thereof, and the scope thereof is determined by the claims that follow.

What is claimed is:

1. A method for decoding a string of data bits, encoded with a turbo encoding scheme, in a wireless communication system, comprising:
    identifying one or more a-priori bit values corresponding to expected bit values at one or more identified bit locations in the string of data bits;
    manipulating one or more branch metrics used in a turbo decoding scheme to effectively remove decoding paths, from a collection of possible decoding paths, based at least on the identified one or more a-priori bit values, resulting in one or more remaining decoding paths;
    decoding the string of data bits by selecting a decoding path from the one or more remaining decoding paths; and
    generating a set of mask bits that indicate whether or not one or more of the a-priori bit values are to be considered when removing decoding paths.

2. The method of claim 1, wherein manipulating one or more branch metrics comprises assigning a maximum value to a branch metric of a branch corresponding to a bit value that is the same as an a-priori bit value at an identified bit location in an effort to increase a likelihood a decoding path containing the branch is selected.

3. The method of claim 2, wherein assigning a maximum value to a branch metric of a branch corresponding to a bit value that is the same as an a-priori bit value at an identified bit location comprises:
    setting a value of a prior information input of a decoder to a maximum value to increase the likelihood the decoding path containing the branch is selected.

4. The method of claim 1, wherein manipulating one or more branch metrics comprises assigning a minimum value to a branch metric of a branch corresponding to a bit value that is different than an a-priori bit value at an identified bit location in an effort to decrease a likelihood a decoding path containing the branch is selected.

5. The method of claim 4, wherein assigning a minimum value to a branch metric of a branch corresponding to a bit value that is different than an a-priori bit value at an identified bit location comprises:
    setting a value of a prior information input of a decoder to a minimum value to decrease the likelihood the decoding path containing the branch is selected.

6. The method of claim 1, wherein identifying the set of a-priori bit values comprises identifying a set of bit values based on a Turbo coding scheme supported by a wireless communications system.

7. The method of claim 1, further comprising:
    adjusting one or more bits of the set of mask bits to indicate one or more of the a-priori bit values has become unknown.

8. A receiver for decoding a string of data bits, encoded with a turbo encoding scheme, in a wireless communication system, comprising:
    logic for identifying one or more a-priori bit values corresponding to expected bit values at one or more identified bit locations in the string of data bits;
    logic for manipulating one or more branch metrics used in a turbo decoding scheme to effectively remove decoding paths, from a collection of possible decoding paths, based at least on the identified one or more a-priori bit values, resulting in one or more remaining decoding paths;
    logic for decoding the string of data bits by selecting a decoding path from the one or more remaining decoding paths; and
    logic for generating a set of mask bits that indicate whether or not one or more of the a-priori bit values are to be considered when removing decoding paths.

9. The receiver of claim 8, wherein the logic for manipulating one or more branch metrics is configured to assign a maximum value to a branch metric of a branch corresponding to a bit value that is the same as an a-priori bit value at an identified bit location in an effort to increase a likelihood a decoding path containing the branch is selected.

10. The receiver of claim 9, wherein the logic for manipulating one or more branch metrics is configured to assign a maximum value to a branch metric of a branch corresponding to a bit value that is the same as an a-priori bit value at an identified bit location by:
    setting a value of a prior information input of a decoder to a maximum value to increase the likelihood the decoding path containing the branch is selected.

11. The receiver of claim 8, wherein the logic for manipulating one or more branch metrics is configured to assign a minimum value to a branch metric of a branch corresponding to a bit value that is different than an a-priori bit value at an identified bit location in an effort to decrease a likelihood a decoding path containing the branch is selected.

12. The receiver of claim 11, wherein the logic for manipulating one or more branch metrics is configured to assign a minimum value to a branch metric of a branch corresponding to a bit value that is different than an a-priori bit value at an identified bit location by:
    setting a value of a prior information input of a decoder to a minimum value to decrease the likelihood the decoding path containing the branch is selected.

13. The receiver of claim 8, wherein the logic for identifying the set of a-priori bit values is configured to identify a set of bit values based on a Turbo coding scheme supported by a wireless communications system.

14. The receiver of claim 8, further comprising:
logic for adjusting one or more bits of the set of mask bits to indicate one or more of the a-priori bit values has become unknown.

15. An apparatus for decoding a string of data bits, encoded with a turbo encoding scheme, in a wireless communication system, comprising:
means for identifying one or more a-priori bit values corresponding to expected bit values at one or more identified bit locations in the string of data bits;
means for manipulating one or more branch metrics used in a turbo decoding scheme to effectively remove decoding paths, from a collection of possible decoding paths, based at least on the identified one or more a-priori bit values, resulting in one or more remaining decoding paths;
means for decoding the string of data bits by selecting a decoding path from the one or more remaining decoding paths; and
means for generating a set of mask bits that indicate whether or not one or more of the a-priori bit values are to be considered when removing decoding paths.

16. The apparatus of claim 15, wherein the means for manipulating the one or more branch metrics includes means for assigning a maximum value to a branch metric of a branch corresponding to a bit value that is the same as an a-priori bit value at an identified bit location in an effort to increase a likelihood a decoding path containing the branch is selected.

17. The apparatus of claim 16, wherein the means for manipulating the one or more branch metrics includes means for assigning a maximum value to a branch metric of a branch corresponding to a bit value that is the same as an a-priori bit value at an identified bit location by:
setting a value of a prior information input of a decoder to a maximum value to increase the likelihood the decoding path containing the branch is selected.

18. The apparatus of claim 15, wherein the means for manipulating the one or more branch metrics includes means for assigning a minimum value to a branch metric of a branch corresponding to a bit value that is different than an a-priori bit value at an identified bit location in an effort to decrease a likelihood a decoding path containing the branch is selected.

19. The apparatus of claim 18, wherein the means for manipulating one or more branch metrics includes means for assigning a minimum value to a branch metric of a branch corresponding to a bit value that is different than an a-priori bit value at an identified bit location by:
setting a value of a prior information input of a decoder to a minimum value to decrease the likelihood the decoding path containing the branch is selected.

20. The apparatus of claim 15, wherein the means for identifying the set of a-priori bit values includes means for identifying a set of bit values based on a Turbo coding scheme supported by a wireless communications system.

21. The apparatus of claim 15, further comprising:
means for adjusting one or more bits of the set of mask bits to indicate one or more of the a-priori bit values has become unknown.

22. A computer-program apparatus for decoding a string of data bits, encoded with a turbo encoding scheme, in a wireless communication system comprising a computer readable medium having instructions stored thereon, the instructions being executable by one or more processors and the instructions comprising:
instructions for identifying one or more a-priori bit values corresponding to expected bit values at one or more identified bit locations in the string of data bits;
instructions for manipulating one or more branch metrics used in a turbo decoding scheme to effectively remove decoding paths, from a collection of possible decoding paths, based at least on the identified one or more a-priori bit values, resulting in one or more remaining decoding paths;
instructions for decoding the string of data bits by selecting a decoding path from the one or more remaining decoding paths; and
instructions for generating a set of mask bits that indicate whether or not one or more of the a-priori bit values are to be considered when removing decoding paths.

23. The computer-program apparatus of claim 22, wherein the instructions for manipulating the one or more branch metrics comprises instructions for assigning a maximum value to a branch metric of a branch corresponding to a bit value that is the same as an a-priori bit value at an identified bit location in an effort to increase a likelihood a decoding path containing the branch is selected.

24. The computer-program apparatus of claim 23, wherein the instructions for assigning the maximum value to the branch metric of the branch corresponding to the bit value that is the same as the a-priori bit value at the identified bit location comprises:
instructions for setting a value of a prior information input of a decoder to a maximum value to increase the likelihood the decoding path containing the branch is selected.

25. The computer-program apparatus of claim 22, wherein the instructions for manipulating the one or more branch metrics comprises instructions for assigning a minimum value to a branch metric of a branch corresponding to a bit value that is different than an a-priori bit value at an identified bit location in an effort to decrease a likelihood a decoding path containing the branch is selected.

26. The computer-program apparatus of claim 25, wherein the instructions for assigning the minimum value to the branch metric of the branch corresponding to the bit value that is different than the a-priori bit value at the identified bit location comprises:
instructions for setting a value of a prior information input of a decoder to a minimum value to decrease the likelihood the decoding path containing the branch is selected.

27. The computer-program apparatus of claim 22, wherein the instructions for identifying the set of a-priori bit values comprises instructions for identifying a set of bit values based on a Turbo coding scheme supported by a wireless communications system.

28. The computer-program apparatus of claim 22, wherein the instructions further comprise:
instructions for adjusting one or more bits of the set of mask bits to indicate one or more of the a-priori bit values has become unknown.

* * * * *